United States Patent [19]

Ruelle

[11] Patent Number: 4,749,895
[45] Date of Patent: Jun. 7, 1988

[54] DEVICE FOR FEEDING ELECTRICITY TO APPARATUS PLACED INSIDE A FARADAY CAGE

[75] Inventor: Philippe Ruelle, Auray, France

[73] Assignee: SIEPEL-Societe Industrielle de'Etudes et Protection Electronique, France

[21] Appl. No.: 97,187

[22] Filed: Sep. 16, 1987

[30] Foreign Application Priority Data

Sep. 25, 1986 [FR] France .................. 86 13390

[51] Int. Cl.⁴ .................. H02K 47/20; H05K 9/00
[52] U.S. Cl. ........................... 310/113; 174/35 MS
[58] Field of Search .................. 174/35 R, 35 MS; 310/71, 75, 85, 89, 113, 308, 309; 333/12, 182; 350/312; 361/119, 120; 439/220

[56] References Cited

U.S. PATENT DOCUMENTS

| 1,994,905 | 3/1935 | Bowles | 333/12 |
| 2,920,174 | 1/1960 | Haagensen | 174/35 MS |
| 3,385,970 | 5/1968 | Coffin, Jr. et al. | 174/35 MS |
| 3,493,760 | 2/1970 | Hoadley | 174/35 MS |
| 4,041,364 | 8/1977 | Gauper, Jr. | 336/84 R |

FOREIGN PATENT DOCUMENTS 2903798 8/1980 Fed. Rep. of Germany .
887562 5/1968 France .
2223939 10/1974 France .

Primary Examiner—Peter S. Wong
Assistant Examiner—D. L. Rebsch
Attorney, Agent, or Firm—Gerald J. Ferguson, Jr.; Michael P. Hoffman

[57] ABSTRACT

A device for feeding electricity into a Faraday cage comprises an electrical generator (8), a generator drive motor (3), and a linkage (12, 24) for mechanically coupling the generator and the motor. The device is characterized in that it includes linkages (2, 12, 24) for electrically isolating the motor and the generator from each other, together with an electromagnetic screening element (7, 15; 20) surrounding the generator and connected to the Faraday cage, the screening element including at least one waveguide passage (14, 25) through which the mechanical coupler extends.

3 Claims, 1 Drawing Sheet

DEVICE FOR FEEDING ELECTRICITY TO APPARATUS PLACED INSIDE A FARADAY CAGE

The present invention relates to a circuit for feeding electricity into a Faraday cage.

BACKGROUND OF THE INVENTION

The main property of a Faraday cage is formation of an isolating barrier against coupling electromagnetic waves between the inside and the outside of the Faraday cage. This property is used either to prevent an electromagnetic signal that is emitted inside the Faraday cage from being picked up outside it, as is particularly true when it is desired to protect secret messages transmitted by telecommunications means; or elst to protect the inside of the cage against external electromagnetic influences, for example to protect apparatus which is sensitive to electromagnetic waves from a magnetic storm as may be triggered by a nuclear attack.

The main problem with using Faraday cages is feeding electricity to apparatus disposed inside the cage. If an electricity power cable is merely passed through the wall of the Faraday cage, even if the opening through the wall has dimensions appropriate for forming a waveguide, then the electric cable is subjected to electromagnetic radiation on either side of the wall, and it transmits the radiation by conduction to the other side.

In order to avoid transmitting electromagnetic waves via the electricity power supply cable, Faraday cages have already been fed with electricity via filters disposed at the wall of the cage, with the filter housings being connected to the cage wall. However, such filters which are generally constituted by capacitors and inductors and are matched only to certain frequencies of electromagnetic waves, thereby giving rise to a limited filtering effect. Further, leakage currents from these filters, which may be quite high, are to be found in the grounding of the cage and may thus be picked up from outside the cage and decoded in order to extract information about the electromagnetic waves which are emitted inside the cage.

Preferred embodiments of the present invention provide a device for feeding electricity into a Faraday cage without transmitting any electromagnetic phenomena between the inside and the outside of the Faraday cage.

SUMMARY OF THE INVENTION

In order to achieve this aim, the present invention provides a dvice for feeding electricity into a Faraday cage, the device comprising an electrical generator, a generator drive motor, and means for mechanically coupling the generator and the motor, the device being characterized in that it includes means for electrically isolating the motor and the generator from each other, together with an electromagnetic screening element surrounding the generator and connected to the Faraday cage, said screening element including at least one waveguide passage through which said mechanical coupling means extend.

Thus, from the electromagnetic point of view, it is as though the generator were inside the Faraday cage and total electromagnetic isolation is ensured by the mechanical coupling means.

In an advantageous version of the invention, the generator is disposed inside the Faraday cage and the screening element surrounding the generator is constituted by the Faraday cage itself. Thus, the power supply circuit is put into place very simply, merely by passing the mechanical coupling means through an opening in the wall, said opening having the dimensions of a waveguide.

In another advantageous version of the invention, the electromagnetic screening element is a conductive housing surrounding the generator and connected to one of the walls of the Faraday cage by a conducting tubular sheath having a cable connecting the generator to the inside of the Faraday cage running therealong. In this way, the electrical power supply circuit may be physically disposed outside the Faraday cage so that heat generated by generator operation is not transmitted into the Faraday cage.

BRIEF DESCRIPTION OF THE DRAWING

Other characteristics and advantages of the invention appear from reading the following description made with reference to the accompanying drawing, in which.

MORE DETAILED DESCRIPTION

Figure 1:
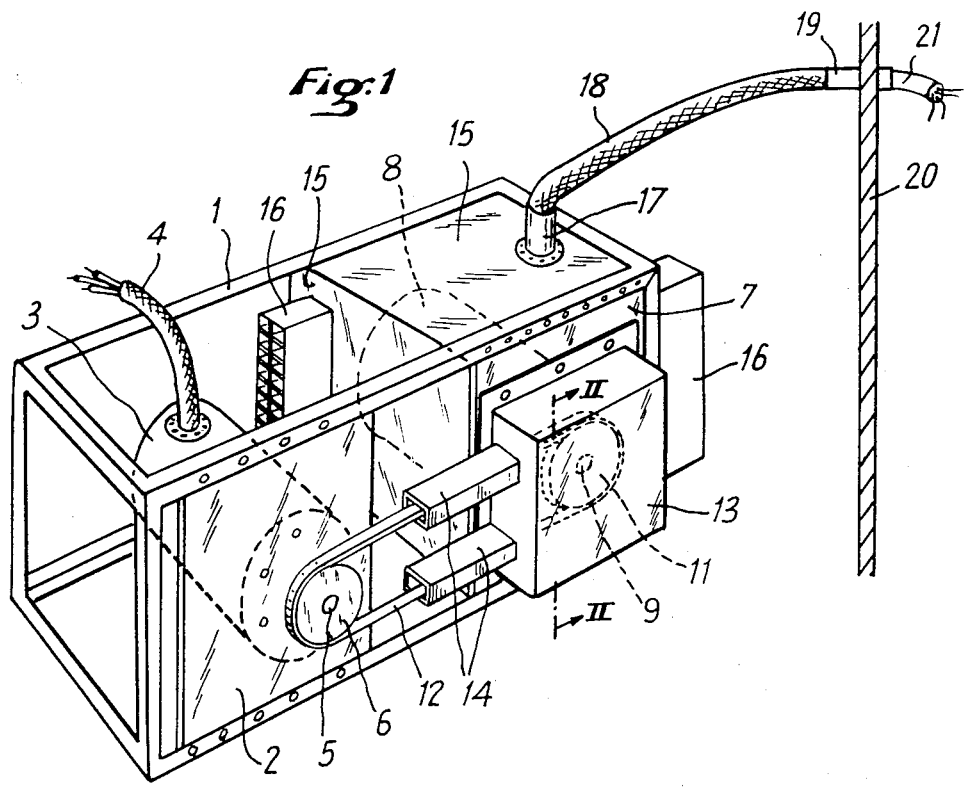
FIG. 1 is a perspective view of a first embodiment of a circuit in accordance with the invention.
Figure 2:
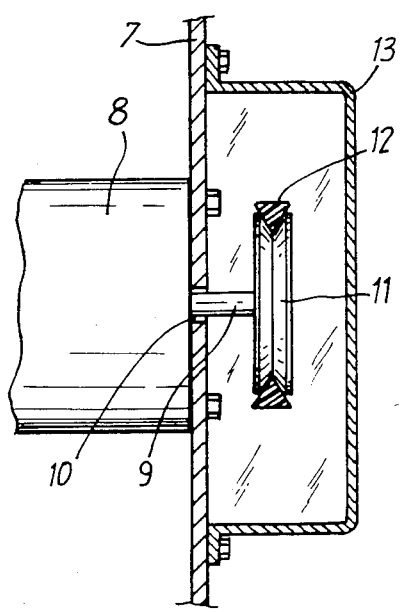
FIG. 2 is a section view on line II—II of FIG. 1.

With reference to FIGS. 1 and 2, a first embodiment of the device comprises a rectangular box frame 1 made from angle bars. An electrically insulating plate 2 is fixed on one face of the frame and supports an electric motor 3 which is connected to the electricity mains via a conventional electric cable 4. The shaft 5 of the electric motor 3 passes through the insulating wall 2 and is fitted with a drive pulley wheel 6.

An electrically conductive plate 7, for example a brass plate, is fixed to the same face of the frame 1 as the insulating plate 2 and supports an electrical generator 8, for example an alternator. The shaft 9 of the alternator 8 passes through an opening 10 in the plate 7 and is fitted with a pulley wheel 11. The drive wheel 6 and the alternator wheel 11 are connected by an insulating belt 12. An electrically conductive cover 13, e.g. a brss cover, is fixed to the conducting plate 7 and surrounds the pulley wheel 11 together with a portion of the belt 12. Where the two strands of the belt 12 pass through the side wall of the cover 13, the cover 13 is fitted with waveguide passages 14.

A series of conductive plates 15, e.g. brass plates, are fixed to each other and to the conductive plate 7 so as to surround the generator 8 and constitute a conductive housing containing it. The two side plates 15 include respective gratings of waveguide openings 16 for ventilating the housing containing the generator 8. The top conducting plate 15 has an opening with a waveguide feedthrough 17 which is electrically bonded to a conductive tubular sheath 18 whose end furthest from the feedthrough 17 is electrically bonded to a second conductive waveguide feedthrough 19 passing through a wall 20 of the Faraday cage. An electric cable 21 extends inside the conductive sheath 18 and through the feedthroughs 17 and 19 in order to connect the generator to the inside of the Faraday cage.

It may be observed that by virtue of the connection between the top conductive plate 15 and the wall 20 of the Faraday cage, and from the electromagnetic point of view the generator 8 is therefore in a situation equivalent to being physically disposed inside the Faraday cage. Any electromagnetic radiation to which the cable 21 may be subjected inside the Faraday cage is thus transmitted by conduction to the generator, but is not transmitted by the belt 12 and can therefore not be detected in the power supply cable 4 to the motor 3.

Figure 3:
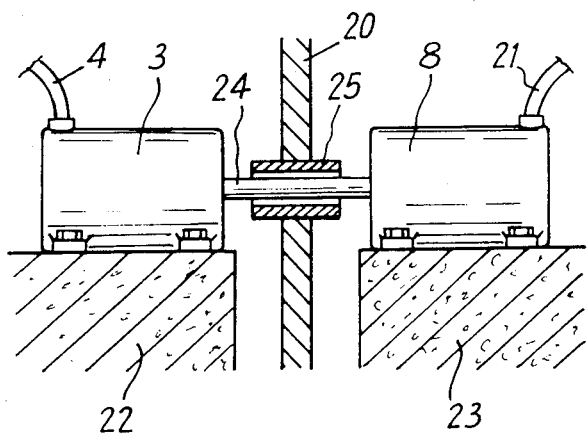
FIG. 3 is a diagram of a second embodiment of a device in accordance with the invention.

FIG. 3 shows another embodiment of the invention in which the motor 3 is fixed on a support 22 outside the Faraday cage while the generator 8 is fixed on a support 23 inside the Faraday cage, with the wall 20 of the Faraday cage extending between the motor 3 and the generator 8. The motor 3 and the generator 8 are disposed facing each other in this case and drive is provided by a single shaft 24 made of insulating material. The shaft 24 extends along a waveguide 25 made through the wall 20. In this case there is no need to provide a conductive sheath around the cable 21.

Naturally the invention is not limited to the embodiments described above, and variants may be applied thereto without going beyond the scope of the invention. In particular, in the embodiment of FIGS. 1 and 2, the cover 13 may be omitted provided the opening 10 through the plate 7 is in the form of a waveguide and the shaft 9 is made of insulating material.

Further, although the invention has been described with reference to an electrically powered drive motor 3, it would naturally be possible to provide any other type of motor, for example a motor running on compressed gas, or a heat engine.

I claim:

1. A device for feeding electricity into a Faraday cage, the device comprising an electrical generator, a generator drive motor, and means for mechanically coupling the generator and the motor, the device further including means for electrically isolating the motor and the generator from each other, together with an electromagnetic screening element surrounding the generator and connected to a Faraday cage, said screening element including at least one waveguide passage through which said mechanical coupling means extend.

2. A device for feeding electricity into a Faraday cage according to claim 1, wherein the generator is disposed inside the Faraday cage and the screening element surrounding the generator is constituted by the Faraday cage itself.

3. A device for feeding electricity into a Faraday cage according to claim 1, wherein the electromagnetic screening element is a conductive housing surrounding the generator and connected to a wall of the Faraday cage via a conducting tubular sheath inside which there extends a cable connecting the generator to the inside of the Faraday cage.

* * * * *